(12) United States Patent
Chae et al.

(10) Patent No.: US 10,462,692 B2
(45) Date of Patent: Oct. 29, 2019

(54) METHOD AND APPARATUS FOR MEASURING D2D SIGNAL OR SELECTING RELAY IN WIRELESS COMMUNICATION SYSTEM

(71) Applicant: LG ELECTRONICS INC., Seoul (KR)

(72) Inventors: Hyukjin Chae, Seoul (KR); Hanbyul Seo, Seoul (KR); Seungmin Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 15/564,422

(22) PCT Filed: Apr. 18, 2016

(86) PCT No.: PCT/KR2016/004029
§ 371 (c)(1),
(2) Date: Oct. 4, 2017

(87) PCT Pub. No.: WO2016/167635
PCT Pub. Date: Oct. 20, 2016

(65) Prior Publication Data
US 2018/0139640 A1 May 17, 2018

Related U.S. Application Data

(60) Provisional application No. 62/149,512, filed on Apr. 17, 2015, provisional application No. 62/161,243, (Continued)

(51) Int. Cl.
*H04W 24/10* (2009.01)
*H04W 24/02* (2009.01)
(Continued)

(52) U.S. Cl.
CPC ........... *H04W 24/10* (2013.01); *H03M 13/09* (2013.01); *H04B 17/318* (2015.01);
(Continued)

(58) Field of Classification Search
CPC ...................................................... H04W 24/10
See application file for complete search history.

(56) References Cited

U.S. PATENT DOCUMENTS 9,319,231 B2 * 4/2016 Kim ........................ H04W 4/70
9,660,782 B2 * 5/2017 Jang ...................... H04L 5/0092
(Continued)

FOREIGN PATENT DOCUMENTS

CN 104105158 10/2014
WO 2012091420 7/2012
(Continued)

OTHER PUBLICATIONS

PCT International Application No. PCT/KR2016/004029, Written Opinion of the International Searching Authority dated Aug. 3, 2016, 20 pages.
(Continued)

*Primary Examiner* — Parth Patel
(74) *Attorney, Agent, or Firm* — Lee Hong Degerman Kang & Waimey

(57) ABSTRACT

An embodiment of the present invention relates to a method for performing measurement by a terminal in a wireless communication system, the method comprising the steps of: receiving D2D signals transmitted by a plurality of relay terminals; and performing measurement using at least one signal among the D2D signals, wherein the D2D signal subjected to the measurement is a D2D signal having a valid CRC.

8 Claims, 9 Drawing Sheets

Related U.S. Application Data filed on May 13, 2015, provisional application No. 62/166,018, filed on May 25, 2015, provisional application No. 62/202,161, filed on Aug. 6, 2015, provisional application No. 62/204,426, filed on Aug. 12, 2015.

(51) Int. Cl.

| | | |
|---|---|---|
| H04W 24/08 | (2009.01) | |
| H04B 17/318 | (2015.01) | |
| H03M 13/09 | (2006.01) | |
| H04L 25/02 | (2006.01) | |
| H04W 72/12 | (2009.01) | |
| H04W 48/16 | (2009.01) | |
| H04L 1/00 | (2006.01) | |
| H04W 88/04 | (2009.01) | |
| H04L 5/00 | (2006.01) | |
| H04W 48/20 | (2009.01) | |
| H04W 84/04 | (2009.01) | |

(52) U.S. Cl.
CPC ......... *H04L 25/0204* (2013.01); *H04W 24/02* (2013.01); *H04W 24/08* (2013.01); *H04W 48/16* (2013.01); *H04W 72/1231* (2013.01); *H04L 1/004* (2013.01); *H04L 5/0044* (2013.01); *H04W 48/20* (2013.01); *H04W 84/047* (2013.01); *H04W 88/04* (2013.01)

(56) References Cited

U.S. PATENT DOCUMENTS

| | | | | |
|---|---|---|---|---|
| 2010/0120397 A1* | 5/2010 | Kazmi | ............... | H04B 7/15542 455/410 |
| 2010/0157845 A1* | 6/2010 | Womack | ............. | H04B 7/2606 370/254 |
| 2011/0128882 A1* | 6/2011 | Shimizu | ............... | H04J 11/0069 370/252 |
| 2011/0128883 A1* | 6/2011 | Chung | ................... | H04B 7/155 370/252 |
| 2013/0039243 A1* | 2/2013 | Park | ................. | H04W 52/0216 370/311 |
| 2013/0040680 A1* | 2/2013 | Kim | ...................... | H04W 8/186 455/509 |
| 2013/0051296 A1* | 2/2013 | Park | ........................ | H04W 4/70 370/311 |
| 2013/0136048 A1* | 5/2013 | Cho | ........................ | H04B 7/00 370/311 |
| 2013/0215757 A1* | 8/2013 | Vandwalle | ........... | H04W 8/005 370/241 |
| 2013/0286918 A1* | 10/2013 | Park | .................... | H04W 72/121 370/311 |
| 2013/0322413 A1* | 12/2013 | Pelletier | ............ | H04W 72/1289 370/336 |
| 2013/0336278 A1* | 12/2013 | Kim | .................... | H04W 72/042 370/329 |
| 2014/0016574 A1* | 1/2014 | Seo | ....................... | H04W 76/14 370/329 |
| 2014/0023008 A1* | 1/2014 | Ahn | ....................... | H04L 5/006 370/329 |
| 2014/0112235 A1* | 4/2014 | Jung | .................... | H04W 48/16 370/312 |
| 2014/0293861 A1* | 10/2014 | Kim | .................... | H04L 12/189 370/312 |
| 2014/0307618 A1* | 10/2014 | Kim | ....................... | H04W 4/70 370/312 |
| 2014/0328329 A1* | 11/2014 | Novlan | ............... | H04W 72/042 370/336 |
| 2014/0380133 A1* | 12/2014 | Kim | ...................... | H04L 1/0041 714/776 |
| 2015/0004901 A1* | 1/2015 | Agiwal | ................. | H04W 76/14 455/39 |
| 2015/0056987 A1* | 2/2015 | Li | ......................... | H04W 8/005 455/434 |
| 2015/0078301 A1* | 3/2015 | Toth | ........................ | H04W 4/08 370/329 |
| 2015/0119056 A1* | 4/2015 | Lee | ..................... | H04W 72/042 455/450 |
| 2015/0173048 A1* | 6/2015 | Seo | ................... | H04W 72/1247 370/329 |
| 2015/0245193 A1* | 8/2015 | Xiong | ..................... | H04W 4/80 370/328 |
| 2015/0271657 A1* | 9/2015 | Xiong | ................... | H04W 8/005 370/329 |
| 2015/0327157 A1* | 11/2015 | Al-Shalash | ........... | H04W 48/16 370/328 |
| 2016/0157080 A1* | 6/2016 | Agiwal | ................... | H04W 4/70 370/328 |
| 2016/0157254 A1* | 6/2016 | Novlan | ................. | H04W 76/14 370/329 |
| 2016/0173239 A1* | 6/2016 | Kim | ...................... | H04L 1/1812 370/329 |
| 2016/0192309 A1* | 6/2016 | Kim | .................. | H04W 56/0015 370/350 |
| 2016/0242029 A1* | 8/2016 | Agiwal | ................. | H04W 76/14 |
| 2016/0255501 A1* | 9/2016 | Van Phan | ............... | H04L 63/20 713/153 |
| 2017/0164272 A1* | 6/2017 | Morioka | ............... | H04W 76/27 |
| 2017/0181150 A1* | 6/2017 | Lee | ......................... | H04W 76/14 |
| 2017/0353985 A1* | 12/2017 | Seo | ........................ | H04L 5/0053 |
| 2018/0007726 A1* | 1/2018 | Li | ............................ | H04W 48/16 |
| 2018/0035276 A1* | 2/2018 | Kang | .................... | H04W 8/005 |
| 2018/0041605 A1* | 2/2018 | Zhang | ..................... | H04W 4/70 |
| 2018/0041957 A1* | 2/2018 | Xiong | ............... | H04W 72/1268 |
| 2018/0054693 A1* | 2/2018 | Agiwal | ................. | H04W 76/14 |
| 2018/0063855 A1* | 3/2018 | Xu | ........................ | H04W 72/12 |
| 2018/0124633 A1* | 5/2018 | Hwang | ................. | H04W 28/02 |
| 2018/0139599 A1* | 5/2018 | Yasukawa | ............... | H04W 8/00 |

FOREIGN PATENT DOCUMENTS

| | | |
|---|---|---|
| WO | 2014179294 | 11/2014 |
| WO | 2015126567 | 8/2015 |

OTHER PUBLICATIONS

European Patent Office Application Serial No. 16780358.4, Search Report dated Oct. 12, 2018, 13 pages.
LG Electronics, "Measurement for D2D synchronization", 3GPP TSG RAN WG1 Meeting #79, R1-144882, Nov. 2014, XP050875940, 4 pages.
Qualcomm, "Signal Design for D2D Synchronization", 3GPP TSG RAN WG1 Meeting #78, R1-142964, Aug. 2014, XP050788444, 10 pages.
"UE procedures related to Sidelink", 3rd Generation Partnership (3GPP), Mobile Competence Centre, Dec. 2014, XP050919809, 18 pages.
Motorola, "Introduction of D2D (ProSe) feature into 36.213", 3GPP TSG RAN WG1 Meeting #80, R1-150962, Feb. 2015, XP050932296, 228 pages.
RAN1: "Reply LS on Sidelink measurements for relay UE selection", 3GPP TSG RAN WG2 Meeting #90, R2-152020, R1-153553, May 2015, XP050979049, 1 page.

* cited by examiner (a)

(b)

(a)

(b)

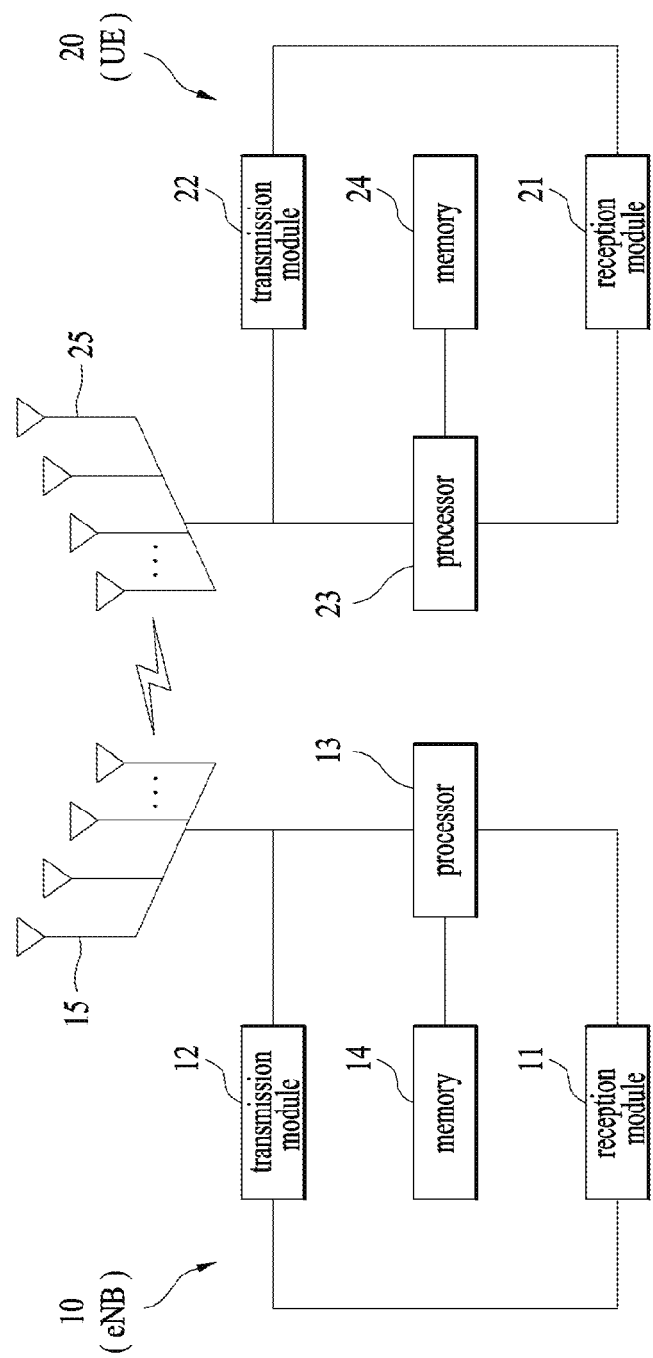

METHOD AND APPARATUS FOR MEASURING D2D SIGNAL OR SELECTING RELAY IN WIRELESS COMMUNICATION SYSTEM

CROSS-REFERENCE TO RELATED APPLICATIONS

This application is the National Stage filing under 35 U.S.C. 371 of International Application No. PCT/KR2016/004029, filed on Apr. 18, 2016, which claims the benefit of U.S. Provisional Application No. 62/149,512, filed on Apr. 17, 2015, 62/161,243, filed on May 13, 2015, 62/166,018, filed May 25, 2015, 62/202,161, filed on Aug. 6, 2015 and 62/204,426, filed on Aug. 12, 2015, the contents of which are all hereby incorporated by reference herein in their entirety.

TECHNICAL FIELD

The following description relates to a wireless communication system and, more particularly, to a method and apparatus for measuring a signal and selecting a relay UE by a Device-to-Device (D2D) UE.

BACKGROUND ART

Wireless communication systems have been widely deployed to provide various types of communication services such as voice or data. In general, a wireless communication system is a multiple access system that supports communication of multiple users by sharing available system resources (a bandwidth, transmission power, etc.) among them. For example, multiple access systems include a Code Division Multiple Access (CDMA) system, a Frequency Division Multiple Access (FDMA) system, a Time Division Multiple Access (TDMA) system, an Orthogonal Frequency Division Multiple Access (OFDMA) system, a Single Carrier Frequency Division Multiple Access (SC-FDMA) system, and a Multi-Carrier Frequency Division Multiple Access (MC-FDMA) system.

D2D communication is a communication scheme in which a direct link is established between User Equipments (UEs) and the UEs exchange voice and data directly without an evolved Node B (eNB). D2D communication may cover UE-to-UE communication and peer-to-peer communication. In addition, D2D communication may be applied to Machine-to-Machine (M2M) communication and Machine Type Communication (MTC).

D2D communication is under consideration as a solution to the overhead of an eNB caused by rapidly increasing data traffic. For example, since devices exchange data directly with each other without an eNB by D2D communication, compared to legacy wireless communication, network overhead may be reduced. Further, it is expected that the introduction of D2D communication will reduce procedures of an eNB, reduce the power consumption of devices participating in D2D communication, increase data transmission rates, increase the accommodation capability of a network, distribute load, and extend cell coverage.

DETAILED DESCRIPTION OF THE INVENTION

Technical Problems

An object of the present invention is to provide details of measurement of a D2D signal and considerations for selecting a relay UE based on measurement of the D2D signal.

Technical tasks obtainable from the present invention are non-limited by the above-mentioned technical task. And, other unmentioned technical tasks can be clearly understood from the following description by those having ordinary skill in the technical field to which the present invention pertains.

Technical Solutions

According to an aspect of the present invention, provided herein is a method of performing measurement by a user equipment (UE) in a wireless communication system, including receiving Device-to-Device (D2D) signals transmitted by a plurality of relay UEs; and performing measurement using one or more of the D2D signals, wherein D2D signals on which the measurement is performed are D2D signals having a valid Cyclic Redundancy Check (CRC).

The method may further include applying filtering to results of the measurement.

The filtering may be applied only to results of the measurement for the same relay identification (ID).

The D2D signals may be Physical Sidelink Discovery Channels (PSDCHs) and the measurement may be calculating of an average of received powers of Demodulation Reference Signal (DMRS) Resource Elements (REs) of the PSDCHs.

A period in which the PSDCHs are transmitted may be 70 ms, 140 ms, or 280 ms which is a multiple of 70 ms.

The method may further include selecting a relay UE based on results of the measurement.

The UE may measure a D2D Received Signal Strength Indicator (RSSI) from a communication signal.

In another aspect of the present invention, provided herein is a User Equipment (UE) for performing measurement in a wireless communication system, including a transmitter and a receiver; and a processor, wherein the processor receives Device-to-Device (D2D) signals transmitted by a plurality of relay UEs and performs measurement using one or more of the D2D signals, and wherein D2D signals on which the measurement is performed are D2D signals having a valid Cyclic Redundancy Check (CRC).

Filtering may be applied to results of the measurement.

The filtering may be applied only to results of the measurement for the same relay identification (ID).

The D2D signals may be Physical Sidelink Discovery Channels (PSDCHs) and the measurement may be calculating of an average of received powers of Demodulation Reference Signal (DMRS) Resource Elements (REs) of the PSDCHs.

A period in which the PSDCHs are transmitted may be 70 ms, 140 ms, or 280 ms which is a multiple of 70 ms.

The UE may select a relay UE based on results of the measurement.

The UE may measure a D2D Received Signal Strength Indicator (RSSI) from a communication signal.

Advantageous Effects

According to the present invention, waste of resources can be minimized and a D2D signal can be transmitted and received based on priority.

Effects according to the present invention are not limited to what has been particularly described hereinabove and other advantages not described herein will be more clearly understood by persons skilled in the art from the following detailed description of the present invention.

DESCRIPTION OF DRAWINGS

The accompanying drawings, which are included to provide a further understanding of the invention, illustrate embodiments of the invention and together with the description serve to explain the principle of the invention.

FIG. 10 is a diagram illustrating configuration of transmission and reception apparatuses.

BEST MODE FOR CARRYING OUT THE INVENTION

Figure 1:
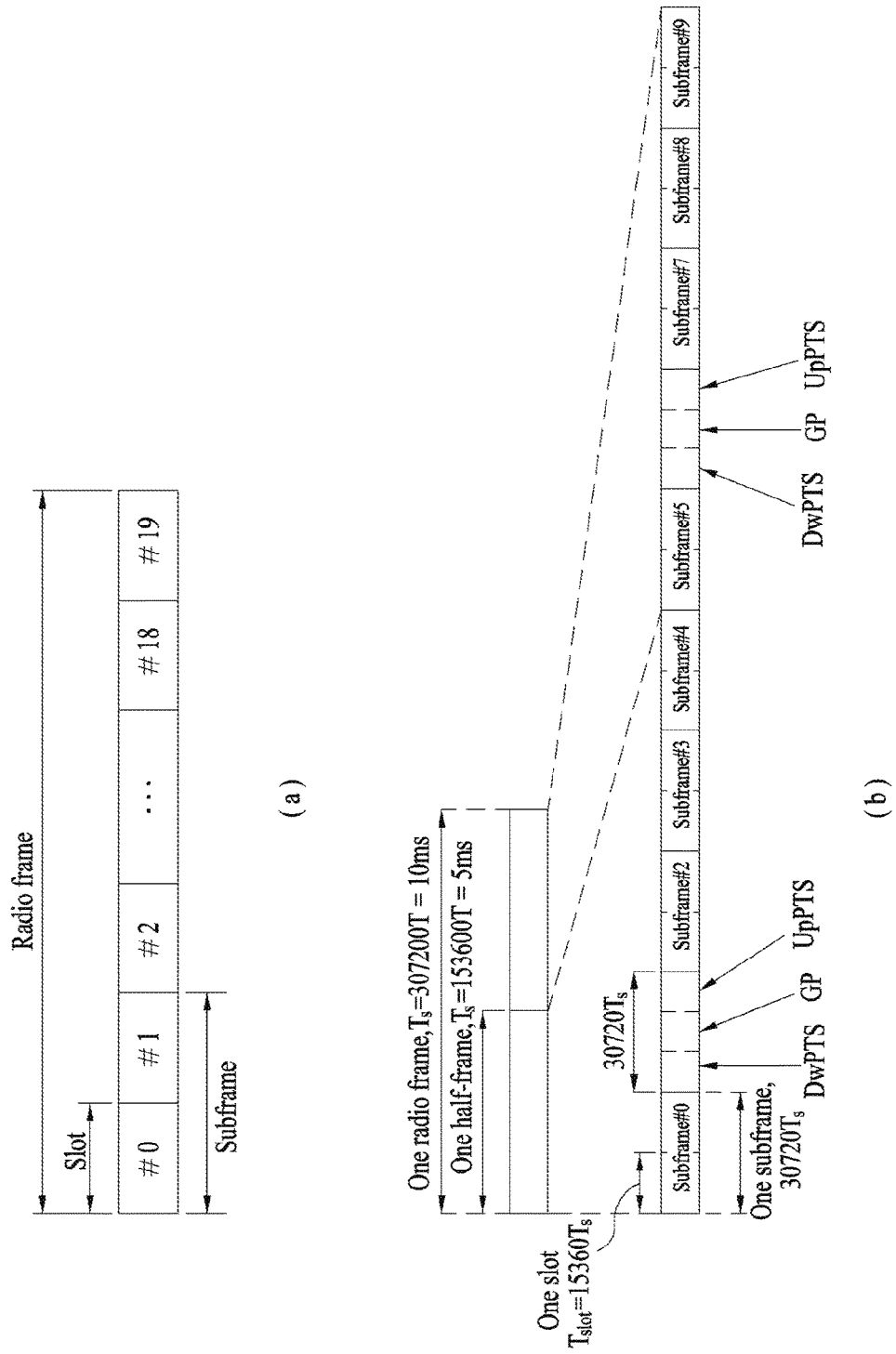
FIG. 1 is a diagram for a structure of a radio frame.

The embodiments of the present invention described hereinbelow are combinations of elements and features of the present invention. The elements or features may be considered selective unless otherwise mentioned. Each element or feature may be practiced without being combined with other elements or features. Further, an embodiment of the present invention may be constructed by combining parts of the elements and/or features. Operation orders described in embodiments of the present invention may be rearranged. Some constructions or features of any one embodiment may be included in another embodiment and may be replaced with corresponding constructions or features of another embodiment.

In the embodiments of the present invention, a description is made, centering on a data transmission and reception relationship between a Base Station (BS) and a User Equipment (UE). The BS is a terminal node of a network, which communicates directly with a UE. In some cases, a specific operation described as performed by the BS may be performed by an upper node of the BS.

Namely, it is apparent that, in a network comprised of a plurality of network nodes including a BS, various operations performed for communication with a UE may be performed by the BS or network nodes other than the BS. The term 'BS' may be replaced with the term 'fixed station', 'Node B', 'evolved Node B (eNode B or eNB)', 'Access Point (AP)', etc. The term 'relay' may be replaced with the term 'Relay Node (RN)' or 'Relay Station (RS)'. The term 'terminal' may be replaced with the term 'UE', 'Mobile Station (MS)', 'Mobile Subscriber Station (MSS)', 'Subscriber Station (SS)', etc.

The term "cell", as used herein, may be applied to transmission and reception points such as a base station (eNB), sector, remote radio head (RRH) and relay, and may also be extensively used by a specific transmission/reception point to distinguish between component carriers.

Specific terms used for the embodiments of the present invention are provided to help the understanding of the present invention. These specific terms may be replaced with other terms within the scope and spirit of the present invention.

In some cases, to prevent the concept of the present invention from being ambiguous, structures and apparatuses of the known art will be omitted, or will be shown in the form of a block diagram based on main functions of each structure and apparatus. Also, wherever possible, the same reference numbers will be used throughout the drawings and the specification to refer to the same or like parts.

The embodiments of the present invention can be supported by standard documents disclosed for at least one of wireless access systems, Institute of Electrical and Electronics Engineers (IEEE) 802, 3rd Generation Partnership Project (3GPP), 3GPP Long Term Evolution (3GPP LTE), LTE-Advanced (LTE-A), and 3GPP2. Steps or parts that are not described to clarify the technical features of the present invention can be supported by those documents. Further, all terms as set forth herein can be explained by the standard documents.

Techniques described herein can be used in various wireless access systems such as Code Division Multiple Access (CDMA), Frequency Division Multiple Access (FDMA), Time Division Multiple Access (TDMA), Orthogonal Frequency Division Multiple Access (OFDMA), Single Carrier-Frequency Division Multiple Access (SC-FDMA), etc. CDMA may be implemented as a radio technology such as Universal Terrestrial Radio Access (UTRA) or CDMA2000. TDMA may be implemented as a radio technology such as Global System for Mobile communications (GSM)/General Packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved-UTRA (E-UTRA) etc. UTRA is a part of Universal Mobile Telecommunications System (UMTS). 3GPP LTE is a part of Evolved UMTS (E-UMTS) using E-UTRA. 3GPP LTE employs OFDMA for downlink and SC-FDMA for uplink. LTE-A is an evolution of 3GPP LTE. WiMAX can be described by the IEEE 802.16e standard (Wireless Metropolitan Area Network (WirelessMAN)-OFDMA Reference System) and the IEEE 802.16m standard (WirelessMAN-OFDMA Advanced System). For clarity, this application focuses on the 3GPP LTE and LTE-A systems. However, the technical features of the present invention are not limited thereto.

LTE/LTE-A Resource Structure/Channel

With reference to FIG. 1, the structure of a radio frame will be described below.

In a cellular Orthogonal Frequency Division Multiplexing (OFDM) wireless Packet communication system, uplink and/or downlink data Packets are transmitted in subframes. One subframe is defined as a predetermined time period including a plurality of OFDM symbols. The 3GPP LTE standard supports a type-1 radio frame structure applicable to Frequency Division Duplex (FDD) and a type-2 radio frame structure applicable to Time Division Duplex (TDD).

FIG. 1(a) illustrates the type-1 radio frame structure. A downlink radio frame is divided into 10 subframes. Each subframe is further divided into two slots in the time domain. A unit time during which one subframe is transmitted is defined as a Transmission Time Interval (TTI). For example, one subframe may be 1 ms in duration and one slot may be 0.5 ms in duration. A slot includes a plurality of OFDM symbols in the time domain and a plurality of Resource Blocks (RBs) in the frequency domain. Because the 3GPP LTE system adopts OFDMA for downlink, an OFDM symbol represents one symbol period. An OFDM symbol may be referred to as an SC-FDMA symbol or symbol period. An RB is a resource allocation unit including a plurality of contiguous subcarriers in a slot.

The number of OFDM symbols in one slot may vary depending on a Cyclic Prefix (CP) configuration. There are two types of CPs: extended CP and normal CP. In the case of the normal CP, one slot includes 7 OFDM symbols. In the case of the extended CP, the length of one OFDM symbol is increased and thus the number of OFDM symbols in a slot is smaller than in the case of the normal CP. Thus when the extended CP is used, for example, 6 OFDM symbols may be included in one slot. If channel state gets poor, for example, during fast movement of a UE, the extended CP may be used to further decrease Inter-Symbol Interference (ISI).

In the case of the normal CP, one subframe includes 14 OFDM symbols because one slot includes 7 OFDM symbols. The first two or three OFDM symbols of each subframe may be allocated to a Physical Downlink Control CHannel (PDCCH) and the other OFDM symbols may be allocated to a Physical Downlink Shared Channel (PDSCH).

FIG. 1(b) illustrates the type-2 radio frame structure. A type-2 radio frame includes two half frames, each having 5 subframes, a Downlink Pilot Time Slot (DwPTS), a Guard Period (GP), and an Uplink Pilot Time Slot (UpPTS). Each subframe is divided into two slots. The DwPTS is used for initial cell search, synchronization, or channel estimation at a UE. The UpPTS is used for channel estimation and acquisition of uplink transmission synchronization to a UE at an eNB. The GP is a period between an uplink and a downlink, which eliminates uplink interference caused by multipath delay of a downlink signal. One subframe includes two slots irrespective of the type of a radio frame.

The above-described radio frame structures are purely exemplary and thus it is to be noted that the number of subframes in a radio frame, the number of slots in a subframe, or the number of symbols in a slot may vary.

Figure 2:
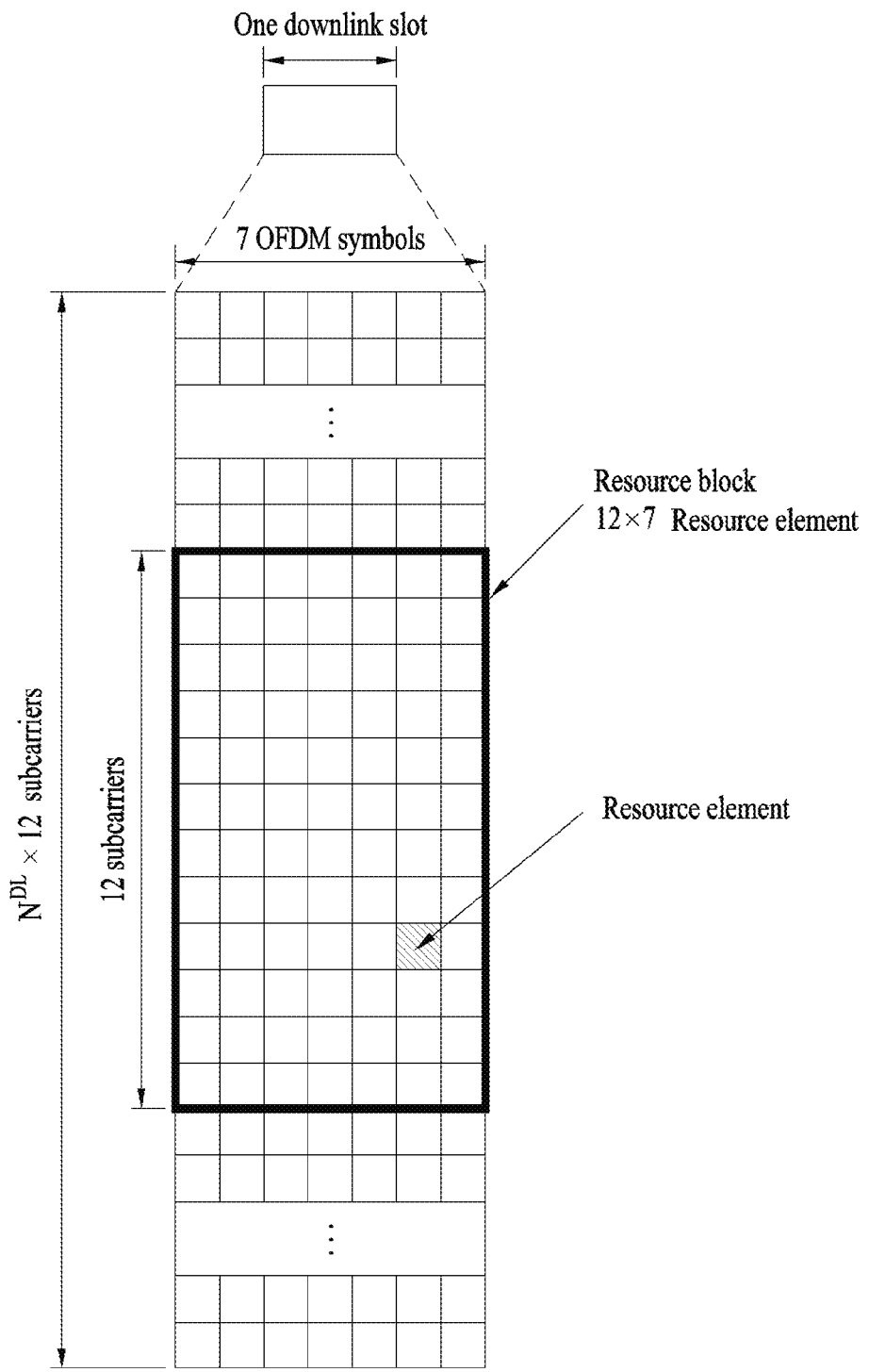
FIG. 2 is a diagram for a resource grid in a downlink slot.

FIG. 2 illustrates the structure of a downlink resource grid for the duration of one downlink slot. A downlink slot includes 7 OFDM symbols in the time domain and an RB includes 12 subcarriers in the frequency domain, which does not limit the scope and spirit of the present invention. For example, a downlink slot may include 7 OFDM symbols in the case of the normal CP, whereas a downlink slot may include 6 OFDM symbols in the case of the extended CP. Each element of the resource grid is referred to as a Resource Element (RE). An RB includes 12×7 REs. The number of RBs in a downlink slot, NDL depends on a downlink transmission bandwidth. An uplink slot may have the same structure as a downlink slot.

Figure 3:
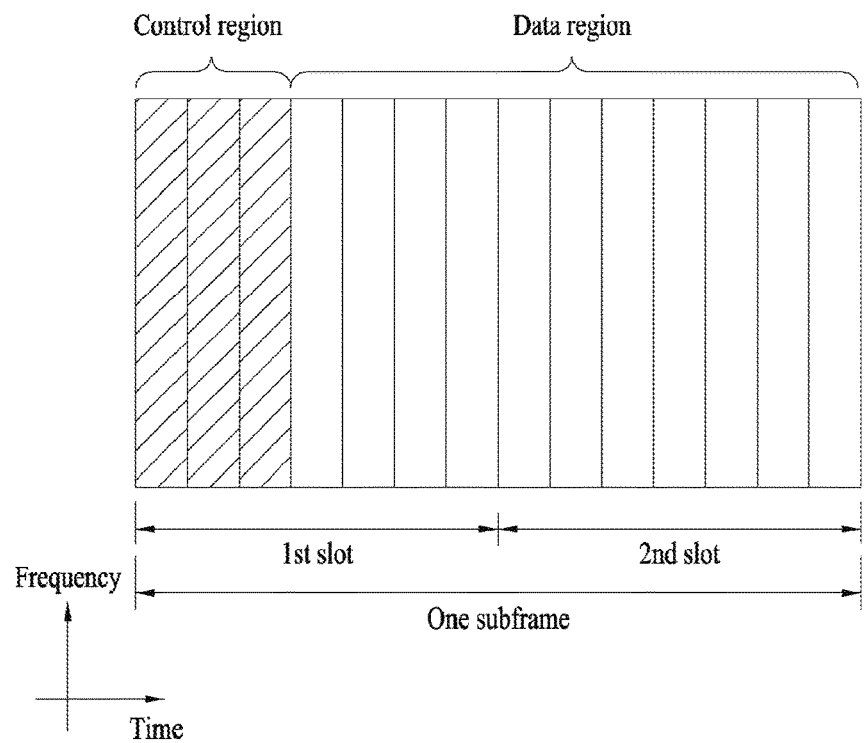
FIG. 3 is a diagram for a structure of a downlink subframe.

FIG. 3 illustrates the structure of a downlink subframe. Up to three OFDM symbols at the start of the first slot in a downlink subframe are used for a control region to which control channels are allocated and the other OFDM symbols of the downlink subframe are used for a data region to which a PDSCH is allocated. Downlink control channels used in the 3GPP LTE system include a Physical Control Format Indicator CHannel (PCFICH), a Physical Downlink Control CHannel (PDCCH), and a Physical Hybrid automatic repeat request (HARQ) Indicator CHannel (PHICH). The PCFICH is located in the first OFDM symbol of a subframe, carrying information about the number of OFDM symbols used for transmission of control channels in the subframe. The PHICH delivers an HARQ ACKnowledgment/Negative ACKnowledgment (ACK/NACK) signal in response to an uplink transmission. Control information carried on the PDCCH is called Downlink Control Information (DCI). The DCI transports uplink or downlink scheduling information, or uplink transmission power control commands for UE groups. The PDCCH delivers information about resource allocation and a transport format for a Downlink Shared CHannel (DL-SCH), resource allocation information about an Uplink Shared CHannel (UL-SCH), paging information of a Paging CHannel (PCH), system information on the DL-SCH, information about resource allocation for a higher-layer control message such as a Random Access Response transmitted on the PDSCH, a set of transmission power control commands for individual UEs of a UE group, transmission power control information, Voice Over Internet Protocol (VoIP) activation information, etc. A plurality of PDCCHs may be transmitted in the control region. A UE may monitor a plurality of PDCCHs. A PDCCH is formed by aggregating one or more consecutive Control Channel Elements (CCEs). A CCE is a logical allocation unit used to provide a PDCCH at a coding rate based on the state of a radio channel. A CCE includes a plurality of RE groups. The format of a PDCCH and the number of available bits for the PDCCH are determined according to the correlation between the number of CCEs and a coding rate provided by the CCEs. An eNB determines the PDCCH format according to DCI transmitted to a UE and adds a Cyclic Redundancy Check (CRC) to control information. The CRC is masked by an Identifier (ID) known as a Radio Network Temporary Identifier (RNTI) according to the owner or usage of the PDCCH. If the PDCCH is directed to a specific UE, its CRC may be masked by a cell-RNTI (C-RNTI) of the UE. If the PDCCH is for a paging message, the CRC of the PDCCH may be masked by a Paging Indicator Identifier (P-RNTI). If the PDCCH carries system information, particularly, a System Information Block (SIB), its CRC may be masked by a system information ID and a System Information RNTI (SI-RNTI). To indicate that the PDCCH carries a Random Access Response in response to a Random Access Preamble transmitted by a UE, its CRC may be masked by a Random Access-RNTI (RA-RNTI).

Figure 4:
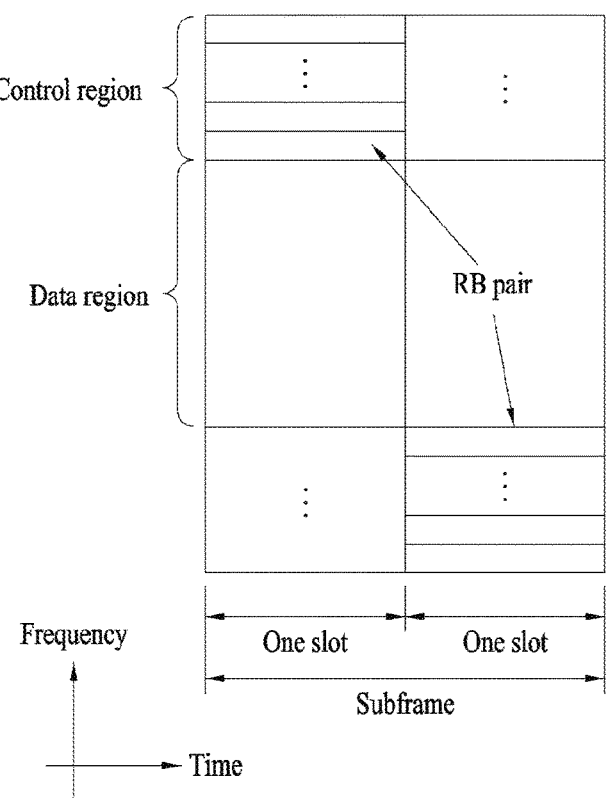
FIG. 4 is a diagram for a structure of an uplink subframe.

FIG. 4 illustrates the structure of an uplink subframe. An uplink subframe may be divided into a control region and a data region in the frequency domain. A Physical Uplink Control CHannel (PUCCH) carrying uplink control information is allocated to the control region and a Physical Uplink Shared Channel (PUSCH) carrying user data is allocated to the data region. To maintain the property of a single carrier, a UE does not transmit a PUSCH and a PUCCH simultaneously. A PUCCH for a UE is allocated to an RB pair in a subframe. The RBs of the RB pair occupy different subcarriers in two slots. Thus it is said that the RB pair allocated to the PUCCH is frequency-hopped over a slot boundary.

Reference Signals (RSs)

In a wireless communication system, a Packet is transmitted on a radio channel. In view of the nature of the radio channel, the Packet may be distorted during the transmission. To receive the signal successfully, a receiver should compensate for the distortion of the received signal using channel information. Generally, to enable the receiver to acquire the channel information, a transmitter transmits a signal known to both the transmitter and the receiver and the receiver acquires knowledge of channel information based on the distortion of the signal received on the radio channel. This signal is called a pilot signal or an RS.

In the case of data transmission and reception through multiple antennas, knowledge of channel states between Transmission (Tx) antennas and Reception (Rx) antennas is required for successful signal reception. Accordingly, an RS should be transmitted through each Tx antenna.

RSs may be divided into downlink RSs and uplink RSs. In the current LTE system, the uplink RSs include:

i) DeModulation-Reference Signal (DM-RS) used for channel estimation for coherent demodulation of information delivered on a PUSCH and a PUCCH; and ii) Sounding Reference Signal (SRS) used for an eNB or a network to measure the quality of an uplink channel in a different frequency.

The downlink RSs are categorized into:

i) Cell-specific Reference Signal (CRS) shared among all UEs of a cell;

ii) UE-specific RS dedicated to a specific UE;

iii) DM-RS used for coherent demodulation of a PDSCH, when the PDSCH is transmitted;

iv) Channel State Information-Reference Signal (CSI-RS) carrying CSI, when downlink DM-RSs are transmitted;

v) Multimedia Broadcast Single Frequency Network (MBSFN) RS used for coherent demodulation of a signal transmitted in MBSFN mode; and vi) positioning RS used to estimate geographical position information about a UE.

RSs may also be divided into two types according to their purposes: RS for channel information acquisition and RS for data demodulation. Since its purpose lies in that a UE acquires downlink channel information, the former should be transmitted in a broad band and received even by a UE that does not receive downlink data in a specific subframe. This RS is also used in a situation like handover. The latter is an RS that an eNB transmits along with downlink data in specific resources. A UE can demodulate the data by measuring a channel using the RS. This RS should be transmitted in a data transmission area.

Modeling of MIMO System

Figure 5:
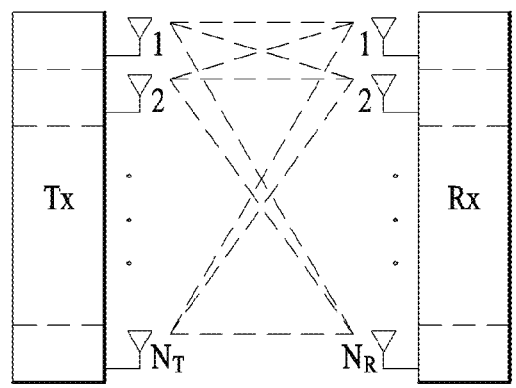
FIG. 5 is a diagram for a configuration of a wireless communication system having multiple antennas.
Figure 5:
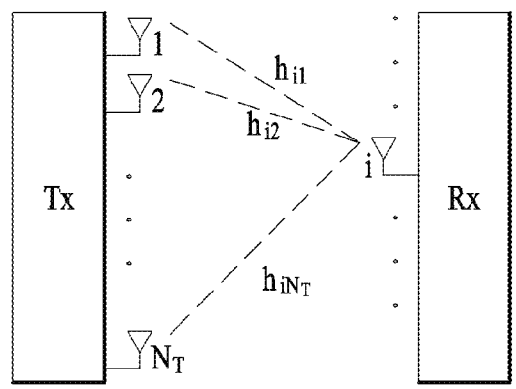

FIG. 5 is a diagram illustrating a configuration of a wireless communication system having multiple antennas.

As shown in FIG. 5(a), if the number of transmit antennas is increased to NT and the number of receive antennas is increased to NR, a theoretical channel transmission capacity is increased in proportion to the number of antennas, unlike the case where a plurality of antennas is used in only a transmitter or a receiver. Accordingly, it is possible to improve a transfer rate and to remarkably improve frequency efficiency. As the channel transmission capacity is increased, the transfer rate may be theoretically increased by a product of a maximum transfer rate Ro upon utilization of a single antenna and a rate increase ratio Ri.

$$R_i = \min(N_T, N_R) \quad \text{[Equation 1]}$$

For instance, in an MIMO communication system, which uses 4 transmit antennas and 4 receive antennas, a transmission rate 4 times higher than that of a single antenna system can be obtained. Since this theoretical capacity increase of the MIMO system has been proved in the middle of 90's, many ongoing efforts are made to various techniques to substantially improve a data transmission rate. In addition, these techniques are already adopted in part as standards for various wireless communications such as 3G mobile communication, next generation wireless LAN and the like.

The trends for the MIMO relevant studies are explained as follows. First of all, many ongoing efforts are made in various aspects to develop and research information theory study relevant to MIMO communication capacity calculations and the like in various channel configurations and multiple access environments, radio channel measurement and model derivation study for MIMO systems, spatiotemporal signal processing technique study for transmission reliability enhancement and transmission rate improvement and the like.

In order to explain a communicating method in an MIMO system in detail, mathematical modeling can be represented as follows. It is assumed that there are NT transmit antennas and NR receive antennas.

Regarding a transmitted signal, if there are NT transmit antennas, the maximum number of pieces of information that can be transmitted is NT. Hence, the transmission information can be represented as shown in Equation 2.

$$s = [s_1, s_2, \ldots, s_{N_T}] \quad \text{[Equation 2]}$$

Meanwhile, transmit powers can be set different from each other for individual pieces of transmission information $s_1, s_2, \ldots, s_{N_T}$, respectively. If the transmit powers are set to $P_1, P_2, \ldots, P_{N_T}$, respectively, the transmission information with adjusted transmit powers can be represented as Equation 3.

$$\hat{s} = [\hat{s}_1, \hat{s}_2, \ldots, \hat{s}_{N_T}]^T = [P_1 s_1, P_2 s_2, \ldots, P_{N_T} s_{N_T}]^T \quad \text{[Equation 3]}$$

In addition, $\hat{S}$ can be represented as Equation 4 using diagonal matrix P of the transmission power.

$$\hat{s} = \begin{bmatrix} P_1 & & 0 \\ & P_2 & \\ & & \ddots \\ 0 & & P_{N_T} \end{bmatrix} \begin{bmatrix} s_1 \\ s_2 \\ \vdots \\ s_{N_T} \end{bmatrix} = Ps \quad \text{[Equation 4]}$$

Assuming a case of configuring NT transmitted signals $x_1, x_2, \ldots, x_{N_T}$, which are actually transmitted, by applying weight matrix W to the information vector $\hat{S}$ having the adjusted transmit powers, the weight matrix W serves to appropriately distribute the transmission information to each antenna according to a transport channel state. $x_1, x_2, \ldots, x_{N_T}$ can be expressed by using the vector X as follows.

$$x = \begin{bmatrix} x_1 \\ x_2 \\ \vdots \\ x_i \\ \vdots \\ x_{N_T} \end{bmatrix} = \begin{bmatrix} w_{11} & w_{12} & \cdots & w_{1N_T} \\ w_{21} & w_{22} & \cdots & w_{2N_T} \\ \vdots & & \ddots & \vdots \\ w_{i1} & w_{i2} & \cdots & w_{iN_T} \\ \vdots & & \ddots & \vdots \\ w_{N_T 1} & w_{N_T 2} & \cdots & w_{N_T N_T} \end{bmatrix} \begin{bmatrix} \hat{s}_1 \\ \hat{s}_2 \\ \vdots \\ \hat{s}_j \\ \vdots \\ \hat{s}_{N_T} \end{bmatrix} = W\hat{s} = WPs \quad \text{[Equation 5]}$$

In Equation 5, $w_{ij}$ denotes a weight between an $i^{th}$ transmit antenna and $j^{th}$ information. W is also called a precoding matrix.

If the NR receive antennas are present, respective received signals $y_1, y_2, \ldots, y_{N_R}$ of the antennas can be expressed as follows.

$$y = [y_1, y_2, \ldots, y_{N_R}]^T \quad \text{[Equation 6]}$$

If channels are modeled in the MIMO wireless communication system, the channels may be distinguished according to transmit/receive antenna indexes. A channel from the transmit antenna j to the receive antenna i is denoted by $h_{ij}$. In $h_{ij}$, it is noted that the indexes of the receive antennas precede the indexes of the transmit antennas in view of the order of indexes.

FIG. 5(b) is a diagram illustrating channels from the NT transmit antennas to the receive antenna i. The channels may be combined and expressed in the form of a vector and a matrix. In FIG. 5(b), the channels from the NT transmit antennas to the receive antenna i can be expressed as follows.

$$h_i^T = [h_{i1}, h_{i2}, \ldots, h_{iN_T}]$$ [Equation 7]

Accordingly, all channels from the NT transmit antennas to the NR receive antennas can be expressed as follows.

$$H = \begin{bmatrix} h_1^T \\ h_2^T \\ \vdots \\ h_i^T \\ \vdots \\ h_{N_R}^T \end{bmatrix} = \begin{bmatrix} h_{11} & h_{12} & \ldots & h_{1N_T} \\ h_{21} & h_{22} & \ldots & h_{2N_T} \\ \vdots & & \ddots & \\ h_{i1} & h_{i2} & \ldots & h_{iN_T} \\ \vdots & & \ddots & \\ h_{N_R 1} & h_{N_R 2} & \ldots & h_{N_R N_T} \end{bmatrix}$$ [Equation 8]

An AWGN (Additive White Gaussian Noise) is added to the actual channels after a channel matrix H. The AWGN $n_1$, $n_2$, ..., $n_{N_R}$ respectively added to the NR receive antennas can be expressed as follows.

$$n = [n_1, n_2, \ldots, n_{N_R}]^T$$ [Equation 9]

Through the above-described mathematical modeling, the received signals can be expressed as follows.

$$y = \begin{bmatrix} y_1 \\ y_2 \\ \vdots \\ y_i \\ \vdots \\ y_{N_R} \end{bmatrix} = \begin{bmatrix} h_{11} & h_{12} & \ldots & h_{1N_T} \\ h_{21} & h_{22} & \ldots & h_{2N_T} \\ \vdots & & \ddots & \\ h_{i1} & h_{i2} & \ldots & h_{iN_T} \\ \vdots & & \ddots & \\ h_{N_R 1} & h_{N_R 2} & \ldots & h_{N_R N_T} \end{bmatrix} \begin{bmatrix} x_1 \\ x_2 \\ \vdots \\ x_j \\ \vdots \\ x_{N_T} \end{bmatrix} + \begin{bmatrix} n_1 \\ n_2 \\ \vdots \\ n_i \\ \vdots \\ n_{N_R} \end{bmatrix} =$$ [Equation 10]

$$Hx + n$$

Meanwhile, the number of rows and columns of the channel matrix H indicating the channel state is determined by the number of transmit and receive antennas. The number of rows of the channel matrix H is equal to the number NR of receive antennas and the number of columns thereof is equal to the number NR of transmit antennas. That is, the channel matrix H is an NR×NT matrix.

The rank of the matrix is defined by the smaller of the number of rows and the number of columns, which are independent from each other. Accordingly, the rank of the matrix is not greater than the number of rows or columns. The rank rank(H) of the channel matrix H is restricted as follows.

$$\text{rank}(H) \leq \min(N_T, N_R)$$ [Equation 11]

Additionally, the rank of a matrix can also be defined as the number of non-zero Eigen values when the matrix is Eigen-value-decomposed. Similarly, the rank of a matrix can be defined as the number of non-zero singular values when the matrix is singular-value-decomposed. Accordingly, the physical meaning of the rank of a channel matrix can be the maximum number of channels through which different pieces of information can be transmitted.

In the description of the present document, 'rank' for MIMO transmission indicates the number of paths capable of sending signals independently on specific time and frequency resources and 'number of layers' indicates the number of signal streams transmitted through the respective paths. Generally, since a transmitting end transmits the number of layers corresponding to the rank number, one rank has the same meaning of the layer number unless mentioned specially.

Synchronization Acquisition of D2D UE

Now, a description will be given of synchronization acquisition between UEs in D2D communication based on the foregoing description in the context of the legacy LTE/LTE-A system. In an OFDM system, if time/frequency synchronization is not acquired, the resulting Inter-Cell Interference (ICI) may make it impossible to multiplex different UEs in an OFDM signal. If each individual D2D UE acquires synchronization by transmitting and receiving a synchronization signal directly, this is inefficient. In a distributed node system such as a D2D communication system, therefore, a specific node may transmit a representative synchronization signal and the other UEs may acquire synchronization using the representative synchronization signal. In other words, some nodes (which may be an eNB, a UE, and a Synchronization Reference Node (SRN, also referred to as a synchronization source)) may transmit a D2D Synchronization Signal (D2DSS) and the remaining UEs may transmit and receive signals in synchronization with the D2DSS.

Figure 6:
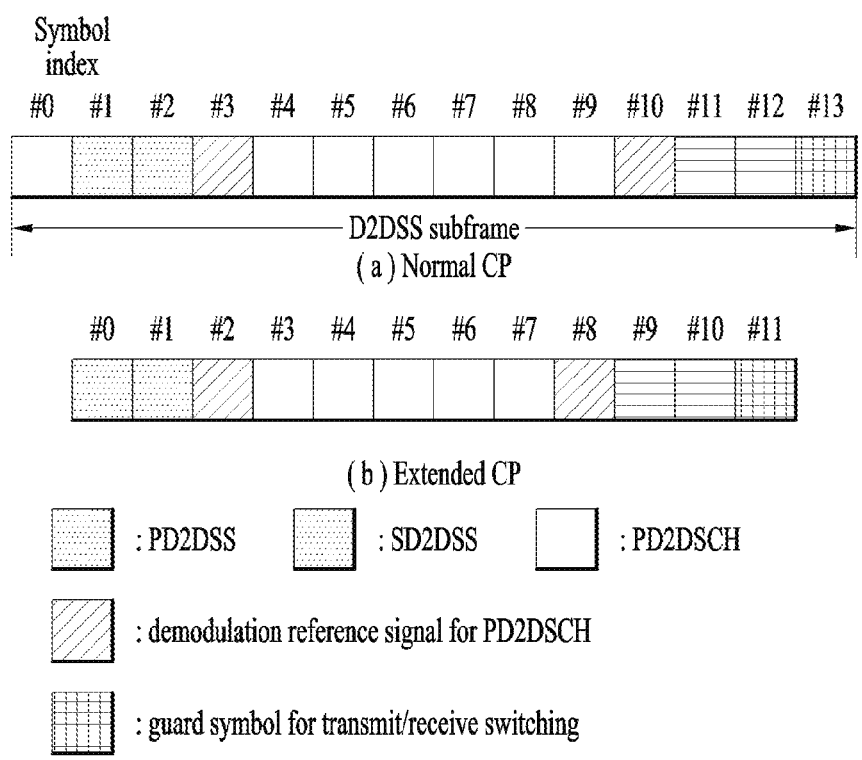
FIG. 6 is a diagram for a subframe in which a D2D synchronization signal is transmitted.

D2DSSs may include a Primary D2DSS (PD2DSS) or a Primary Sidelink Synchronization Signal (PSSS) and a Secondary D2DSS (SD2DSS) or a Secondary Sidelink Synchronization Signal (SSSS). The PD2DSS may be configured to have a similar/modified/repeated structure of a Zadoff-chu sequence of a predetermined length or a Primary Synchronization Signal (PSS). Unlike a DL PSS, the PD2DSS may use a different Zadoff-chu root index (e.g., 26, 37). And, the SD2DSS may be configured to have a similar/modified/repeated structure of an M-sequence or a Secondary Synchronization Signal (SSS). If UEs synchronize their timing with an eNB, the eNB serves as an SRN and the D2DSS is a PSS/SSS. Unlike PSS/SSS of DL, the PD2DSS/SD2DSS follows UL subcarrier mapping scheme. FIG. 6 shows a subframe in which a D2D synchronization signal is transmitted. A Physical D2D Synchronization Channel (PD2DSCH) may be a (broadcast) channel carrying basic (system) information that a UE should first obtain before D2D signal transmission and reception (e.g., D2DSS-related information, a Duplex Mode (DM), a TDD UL/DL configuration, a resource pool-related information, the type of an application related to the D2DSS, etc.). The PD2DSCH may be transmitted in the same subframe as the D2DSS or in a subframe subsequent to the frame carrying the D2DSS. A DMRS can be used to demodulate the PD2DSCH.

The SRN may be a node that transmits a D2DSS and a PD2DSCH. The D2DSS may be a specific sequence and the PD2DSCH may be a sequence representing specific information or a codeword produced by predetermined channel coding. The SRN may be an eNB or a specific D2D UE. In the case of partial network coverage or out of network coverage, the SRN may be a UE.

Figure 7:
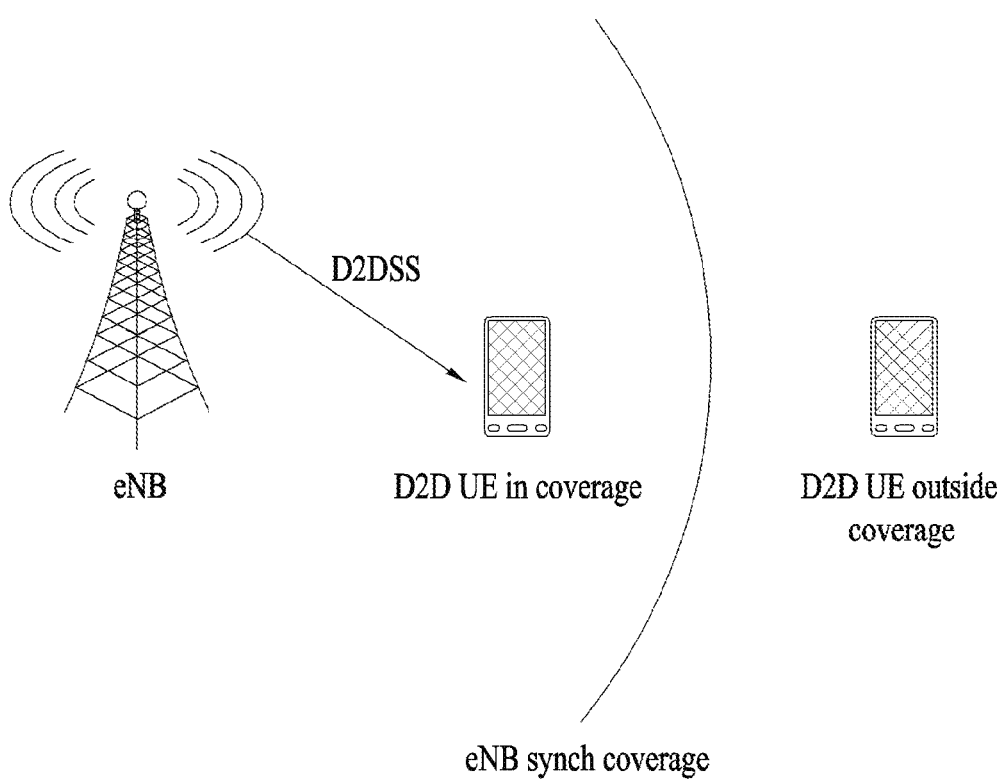
FIG. 7 is a diagram for explaining relay of a D2D signal.

In a situation illustrated in FIG. 7, a D2DSS may be relayed for D2D communication with an out-of-coverage UE. The D2DSS may be relayed over multiple hops. The following description is given with the appreciation that relay of an SS covers transmission of a D2DSS in a separate format according to a SS reception time as well as direct Amplify-and-Forward (AF)-relay of an SS transmitted by an eNB. As the D2DSS is relayed, an in-coverage UE may communicate directly with an out-of-coverage UE.

D2D Resource Pool

Figure 8:
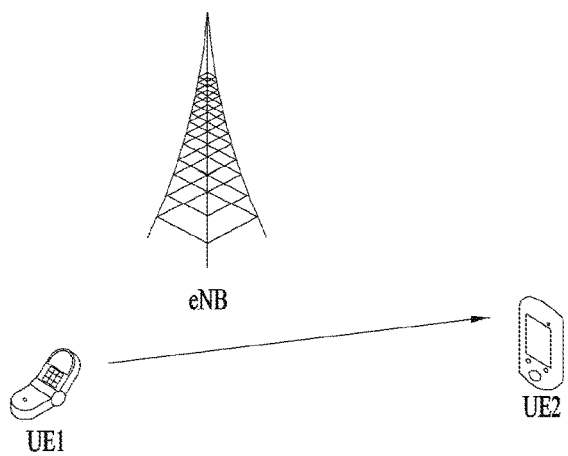
FIG. 8 is a diagram for an example of a D2D resource pool for performing D2D communication.
Figure 8:
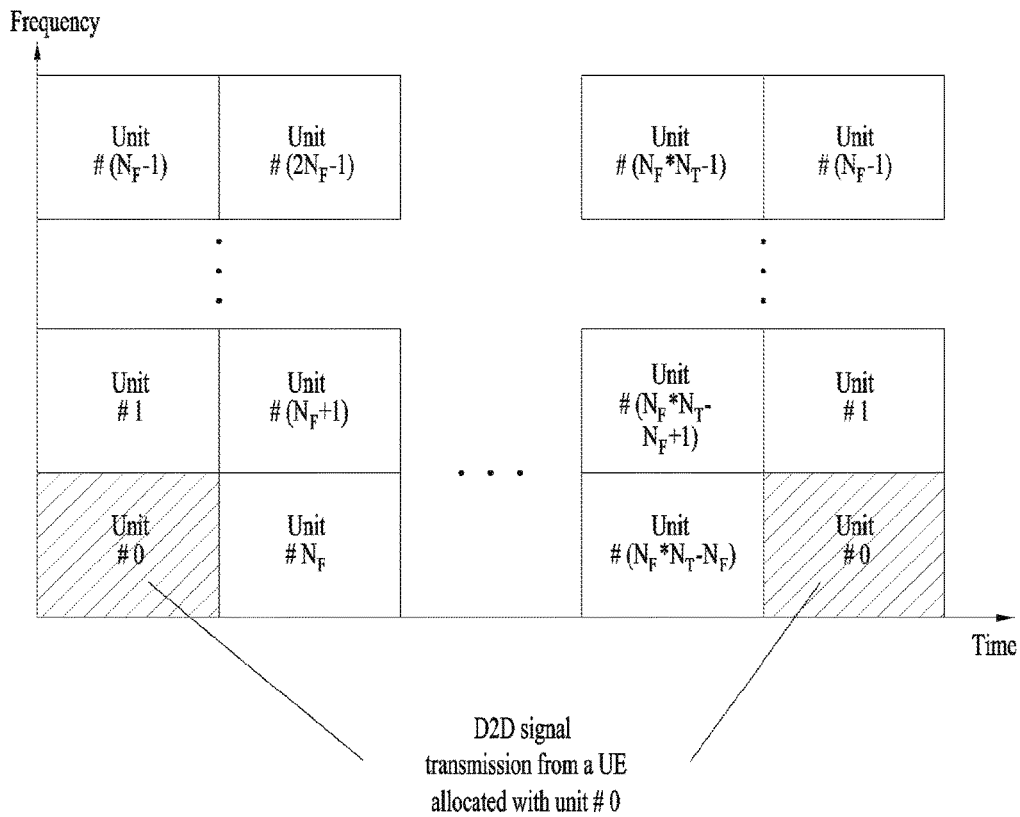

FIG. 8 shows an example of a UE1, a UE2 and a resource pool used by the UE1 and the UE2 performing D2D communication. In FIG. 8 (a), a UE corresponds to a terminal or such a network device as an eNB transmitting and receiving a signal according to a D2D communication scheme. A UE selects a resource unit corresponding to a specific resource from a resource pool corresponding to a set of resources and the UE transmits a D2D signal using the selected resource unit. A UE2 corresponding to a reception UE receives a configuration of a resource pool in which the UE1 is able to transmit a signal and detects a signal of the UE1 in the resource pool. In this case, if the UE1 is located at the inside of coverage of an eNB, the eNB can inform the UE1 of the resource pool. If the UE1 is located at the outside of coverage of the eNB, the resource pool can be informed by a different UE or can be determined by a predetermined resource. In general, a resource pool includes a plurality of resource units. A UE selects one or more resource units from among a plurality of the resource units and may be able to use the selected resource unit(s) for D2D signal transmission. FIG. 8 (b) shows an example of configuring a resource unit. Referring to FIG. 8 (b), the entire frequency resources are divided into the $N_F$ number of resource units and the entire time resources are divided into the $N_T$ number of resource units. In particular, it is able to define $N_F*N_T$ number of resource units in total. In particular, a resource pool can be repeated with a period of $N_T$ subframes. Specifically, as shown in FIG. 8, one resource unit may periodically and repeatedly appear. Or, an index of a physical resource unit to which a logical resource unit is mapped may change with a predetermined pattern according to time to obtain a diversity gain in time domain and/or frequency domain. In this resource unit structure, a resource pool may correspond to a set of resource units capable of being used by a UE intending to transmit a D2D signal.

A resource pool can be classified into various types. First of all, the resource pool can be classified according to contents of a D2D signal transmitted via each resource pool. For example, the contents of the D2D signal can be classified into various signals and a separate resource pool can be configured according to each of the contents. The contents of the D2D signal may include SA (scheduling assignment), a D2D data channel, and a discovery channel. The SA may correspond to a signal including information on a resource position of a D2D data channel, information on MCS (modulation and coding scheme) necessary for modulating and demodulating a data channel, information on a MIMO transmission scheme, information on TA (timing advance), and the like. The SA signal can be transmitted on an identical resource unit in a manner of being multiplexed with D2D data. In this case, an SA resource pool may correspond to a pool of resources that an SA and D2D data are transmitted in a manner of being multiplexed. The SA signal can also be referred to as a D2D control channel or a PSCCH (physical sidelink control channel). The D2D data channel (or, PSSCH (physical sidelink shared channel)) corresponds to a resource pool used by a transmission UE to transmit user data. If an SA and a D2D data are transmitted in a manner of being multiplexed in an identical resource unit, D2D data channel except SA information can be transmitted only in a resource pool for the D2D data channel. In other word, resource elements (REs), which are used to transmit SA information in a specific resource unit of an SA resource pool, can also be used for transmitting D2D data in a D2D data channel resource pool. The discovery channel may correspond to a resource pool for a message that enables a neighboring UE to discover transmission UE transmitting information such as ID of the UE, and the like.

Although contents of D2D signal are identical to each other, it may use a different resource pool according to a transmission/reception attribute of the D2D signal. For example, in case of the same D2D data channel or the same discovery message, the D2D data channel or the discovery signal can be classified into a different resource pool according to a transmission timing determination scheme (e.g., whether a D2D signal is transmitted at the time of receiving a synchronization reference signal or the timing to which a prescribed timing advance is added) of a D2D signal, a resource allocation scheme (e.g., whether a transmission resource of an individual signal is designated by an eNB or an individual transmission UE selects an individual signal transmission resource from a pool), a signal format (e.g., number of symbols occupied by a D2D signal in a subframe, number of subframes used for transmitting a D2D signal), signal strength from an eNB, strength of transmit power of a D2D UE, and the like. For clarity, a method for an eNB to directly designate a transmission resource of a D2D transmission UE is referred to as a mode 1. If a transmission resource region is configured in advance or an eNB designates the transmission resource region and a UE directly selects a transmission resource from the transmission resource region, it is referred to as a mode 2. In case of performing D2D discovery, if an eNB directly indicates a resource, it is referred to as a type 2. If a UE directly selects a transmission resource from a predetermined resource region or a resource region indicated by the eNB, it is referred to as a type 1.

Transmission and Reception of SA

A mode 1 UE can transmit an SA signal (or, a D2D control signal, SCI (sidelink control information)) via a resource configured by an eNB. A mode 2 UE receives a configured resource to be used for D2D transmission. The mode 2 UE can transmit SA by selecting a time frequency resource from the configured resource.

Figure 9:
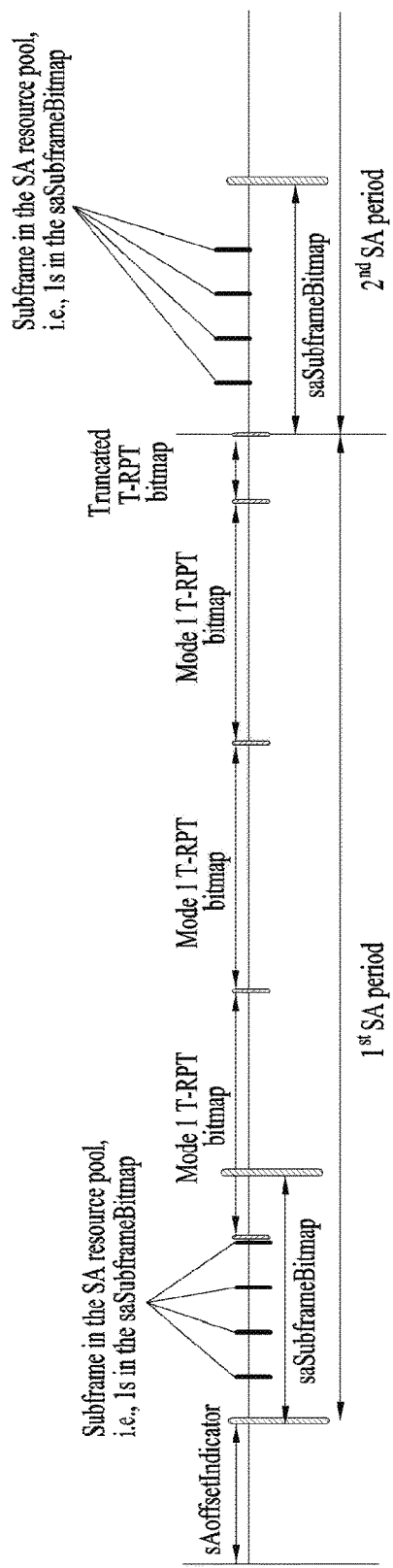
FIG. 9 is a diagram for explaining an SA period.

The SA period can be defined as FIG. 9. Referring to FIG., a first SA period can start at a subframe apart from a specific system frame as much as a prescribed offset (SAOffsetIndicator) indicated by higher layer signaling. Each SA period can include an SA resource pool and a subframe pool for transmitting D2D data. The SA resource pool can include subframes ranging from a first subframe of an SA period to the last subframe among subframes indicated by a subframe bitmap (saSubframeBitmap) to transmit SA. In case of mode 1, T-RPT (time-resource pattern for transmission) is applied to the resource pool for transmitting D2D data to determine a subframe in which an actual data is transmitted. As shown in the drawing, if the number of subframes included in an SA period except the SA resource pool is greater than the number of T-RPT bits, the T-RPT can be repeatedly applied and the lastly applied T-RPT can be applied in a manner of being truncated as many as the number of remaining subframes. The SA may indicate a data transmission position in the form of the T-RPT or through other explicit methods. For example, the SA may indicate a data transmission start position or the number of repetitions of data transmission. More generally, the SA is a channel for indicating time and frequency positions of a data transmission resource and transmitting additional information necessary for data decoding therein. The SA resource pool may be separated from the data pool but partially overlaps with the data pool so as to commonly use a portion of a data region. Alternatively, the data pool and the SA resource pool may be separated in the frequency domain rather than in the time domain.

Meanwhile, for the purpose of D2D communication, information about time and frequency resources is signaled on a Physical Sidelink Broadcast Channel (PSBCH) and a reception UE detects/decodes a D2D signal on the signaled resources. Herein, a pattern of the time resource (or subframe) on which the D2D signal is transmitted is referred to as a T-RPT. In PSBCH format 0, the T-RPT and a frequency resource position are signaled. In this case, in 3GPP LTE Release-12, the number of repetitions of one Media Access Control (MAC) Packet Data Unit (PDU) is fixed to 4 and a redundancy version of the MAC PDU is transmitted in a fixed order such as 0→2→3→1.

Hereinafter, measurement of the D2D signal and selection of a relay UE that uses a result of measurement will be described based on the above-given description. For convenience, while a description will be given focusing on the case in which a signal of the relay UE is measured, the description may be applied to the case in which a signal of a D2D UE that does not perform a relay operation is measured and evaluated.

Measurement of D2D Signal

A D2D UE may receive D2D signals transmitted by a plurality of relay UEs and perform measurement using one or more of the D2D signals. D2D signals used for measurement may be known sequences (e.g., a DMRS, a PSSS, an SSSS, etc.) of all or some of a PSBCH, a PSCCH, a Physical Sidelink Discovery Channel (PSDCH), and a PSSCH. The D2D signals may be signals transmitted by an Out-Of-Network coverage (OON) UE/D2D UE as well as by a relay UE. The reason why the known sequences are used for measurement of a link between UEs is that a power can be accurately calculated by inverting all phases through a multiplication operation of sequences transmitted by a transmitter to a receiver and conjugate sequences. If sequences transmitted by transmission UEs are all equal, a reception UE has a difficulty in accurately discerning which UE has transmitted any sequence. For example, since all UEs use the same DMRS sequence with respect to a PSDCH, it is difficult to distinguish between sequences for measurement of a D2D link between UEs. To this end, a scheme of measuring a D2D signal having a valid CRC and the same discovery ID through filtering is proposed.

Herein, the D2D signal to be measured may be a D2D signal in which a CRC is valid. In addition, filtering, which is applicable to results of measurement, may be applied only to results of measurement of the same relay ID.

For example, the D2D signal may be a PSDCH and measurement may be calculation of an average received power of the PSDCH on DMRS REs (i.e., a D2D Reference Signal Received Power (RSRP)). Alternatively, measurement may be calculation of an average signal quality of the D2D signal (i.e., D2D Received Signal Received Quality (RSRQ) or Signal Interference-plus-Noise Ratio (SINR)) or an average power (D2D Received Signal Strength Indicator (RSSI)) received on symbols.

That is, when the D2D RSRP or D2D RSRQ is measured, D2D signals may be filtered (averaged) only when a CRC is passed in order to exclude measurement when signals are not actually transmitted. If D2D RSRP is measured on all discovery resources, only noise may be measured on resources on which no signals are transmitted. Therefore, whether a signal is present is determined by checking whether a CRC is passed so as to more accurately measure a DMRS of a corresponding resource. Even D2D signals of different UEs may be filtered (averaged) if a CRC is passed. To prevent this phenomenon, filtering (averaging) may be performed with respect to packets having the same UE ID (the same physical layer or higher layer ID) in a state in which a CRC is passed. (In the same context, when the D2D RSRP or D2D RSRQ is measured, a corresponding measurement value may be included in an input value for filtering (averaging) only when the D2D RSRP is above a predetermined threshold.) That is, when a D2D UE measures the D2D RSRP or RSRQ, the D2D UE first performs decoding and, only when a CRC is passed and a specific ID is detected, the D2D UE stores a corresponding measurement value only with respect to the specific ID. Next, only when the same ID is detected, the D2D UE may update the measurement value (or average the measurement value or include the measurement value in an input value).

Meanwhile, when an average power received on symbols is calculated, all or some of symbols or REs on which a known sequence is transmitted or symbols or REs on which a reception power is difficult to accurately measure may be excluded from D2D average power measurement. For example, in the case of a discovery signal, an average power may be calculated in consideration of only REs (of two RBs) on which the discovery signal is transmitted and, in this case, symbols on which a DMRS is transmitted may be excluded from calculation of the average power. Herein, the first symbol and the last symbol may also be excluded. This is because the average power may not be correctly calculated on the first symbol due to an Automatic Gain Control (AGC) operation and a signal may be punctured without being transmitted on the last symbol (according to LTE Release-12) for the purpose of transmission-reception switching or due to inequality of a boundary of concatenated subframes. The reason why symbols/REs on which the known sequence is transmitted are excluded is that signals may create constructive interference when all UEs transmit the same known sequence and thus an excessively high power relative to a power on other symbols may be measured. If channels between UEs are greatly different, since this phenomenon is reduced, symbols/REs on which the known sequence is transmitted may be included for average power measurement per D2D link. Whether symbols/REs on which the known sequence is transmitted are included in average power measurement per D2D link may be differently configured per D2D signal. For example, a PSBCH/SLSS may include the known sequence for measurement and a PSCCH may exclude the known sequence from measurement. Such configuration information may be predetermined.

The above-mentioned D2D RSRQ and D2D RSSI will now be described in detail. If a signal to be measured is a PSBCH, signal quality may be calculated as (power measured in a known sequence such as a DMRS)/(average received power on all symbols). When an average power of symbols (D2D RSSI) is calculated, all or some of the first symbol, the last symbol, a DMRS transmission symbol, and a Secondary Sidelink Synchronization Signal (SSSS) may be excluded from calculation of the average power. Since the first symbol is used for AGC, an average power cannot be accurately calculated on the first symbol. Since the last symbol is punctured, energy may be scarcely detected on the last symbol. Since power backoff may be applied to the SSSS as opposed to other symbols, a transmission power of the SSSS is different from that of other symbols and therefore the SSSS is excluded from calculation of the average power for accuracy. A method of estimating an average power with respect to various symbols in a subframe as well as symbols on which the DMRS is transmitted enables stable estimation of the average power by performing more averages upon calculating the D2D RSSI.

When an average power (D2D RSSI) received on symbols is calculated, although powers of all REs may be used (i.e., D2D RSSI is calculated by averaging powers received on the symbols), only powers of REs on which the DMRS is transmitted may be used to calculate an average power in order to calculate an RSRQ on the REs on which the DMRS is transmitted and exclude powers of the other REs. In this case, the D2D RSRQ may be calculated as "D2D RSRQ=D2D RSRP/D2D RSSI". Since the D2D RSSI is defined as an average power per RE like the D2D RSRP, an additional scaling value is not multiplied by a numerator or a denominator.

When the D2D RSRQ is calculated, a received power in the known sequence (e.g., DMRS) in a denominator term may be excluded from calculation in order to accurately calculate an SINR using pure interference and noise values as the denominator by excluding a power of a signal part received on a corresponding symbol.

When an average power received on symbols is calculated, a symbol on which the known sequence is transmitted (or a symbol used when a D2D RSRP term of the numerator is calculated) may be excluded in order to prevent the D2D RSRQ from being 0 dB when a signal power is remarkably greater than interference plus noise due to a signal term applied to the denominator. When the D2D RSSI is calculated using another scheme, a received power of a symbol on which the DMRS is transmitted may be calculated and the received power may be normalized to RS bandwidth. For example, when a discovery signal of 2 RBs is transmitted and a system bandwidth is 50 RBs, an RSSI of 50 RBs is calculated and the D2D RSRQ is calculated by dividing the RSSI by 25. That is, the D2D RSRQ may be calculated as "D2D RSRQ=D2D RSRP/(a/b*D2D RSSI)" wherein a is the number of RBs of the D2D signal and b is the number of RBs in the system bandwidth. Alternatively, the D2D RSRQ may be calculated as "D2D RSRQ=b*D2D RSRP/(D2D RSSI)".

Meanwhile, when a relay link quality is measured, if an RSRP is measured with respect to a DMRS of a discovery message, an RSSI may be measured in the same resource region (pool) as a region in which the discovery signal is transmitted or in a communication resource region (pool) linked with a discovery resource pool or configured for a relay operation. Alternatively, the RSSI may be measured in a resource pool in which the discovery signal is detected. In this case, the RSSI (received power) may be calculated with respect to all symbols in the pool and a symbol in a subframe in which a D2D synchronization signal is transmitted in the pool may not be included for RSSI calculation. In addition, since a UE cannot receive a signal in a subframe in which the UE transmits a signal unless the UE is a full duplex UE, the subframe may not be included for RSSI calculation. For example, the RSSI is not measured in a subframe of every 40 ms (or a subframe of a preset period) in which a synchronization signal in a resource pool is transmitted. This is because, in a subframe in which a D2D synchronization signal is transmitted, a transmission power different from a power of other D2D signals may be configured. In addition, this is because an additional power control parameter different from a parameter of other D2D signals may be configured for the D2D synchronization signal. Alternatively, the RSSI may be calculated only in a subframe in which a discovery message is detected in order to reduce necessary time and complexity of a UE upon calculating the RSSI. The meaning that the "discovery message is detected" may represent that a CRC is passed in a corresponding subframe.

The UE may select a relay UE based on the above-described measurement result or measure link quality between multiple D2D UEs.

Subject that Measures D2D Signal

A D2D signal may be measured by an in-coverage UE in which an RSRP (and/or an RSRQ) is less than a threshold value. Specifically, the in-coverage UE in which the RSRP (and/or RSRQ) is less than the threshold value in a specific cell or all cells may measure a D2D signal (a discovery or communication signal) of a relay UE (or potential relay UE) and report a measurement value and/or an ID of a discovered relay UE ID (or potential relay UE) to an eNB. In this case, the in-coverage UE in which the RSRP (and/or RSRQ) is less than the threshold value and a packet is being transmitted and received to and from a network may report the measurement value of the relay UE (or potential relay UE) and/or the ID of the discovered relay UE (or potential relay UE) to the eNB at a predetermined period. Alternatively, whenever the relay UE is discovered, the in-coverage UE may perform reporting in one shot. Alternatively, the in-coverage UE may report the measurement value of the discovered UE and/or the ID of the discovered relay UE (or the potential relay UE) to the eNB within a predetermined time window. In this case, the in-coverage UE may selectively report only IDs of UEs having measurement (D2D RSRP and/or RSRQ) values above a predetermined threshold value among discovered relay UEs to the eNB. Alternatively, the in-coverage UE may report information of a relay UE having the best measurement value or report relay UEs having K best measurement values to a network. The threshold value, the value K, etc. used for D2D measurement may be predetermined or configured by the network. This method causes a UE, that is within a cell but is located at an edge so that there is a probability of entering an out-of-coverage region, to previously search for a neighbor relay UE for service continuity and report a measurement value for the relay UE to the network. Then, the network may smoothly perform relay path setup.

Meanwhile, the RSRP (and/or RSRQ) condition may be configured by the eNB or may be predetermined. The RSRP (and/or RSRQ) condition (threshold value) may differ according to a cell. If the RSRP (and/or RSRQ) is less than the threshold value in all cells or a specific cell, the UE performs measurement of a D2D link and/or reports the result of measurement to the network. The RSRP (and/or RSRQ) condition may differ according to cell. For example, if there is heavy load in a specific cell so that it is difficult to directly provide a service in the cell, a higher threshold value than in other cells may be configured and traffic may be offloaded to a relay UE.

Alternatively, the D2D signal may be measured by a UE indicated by the eNB. That is, the eNB may cause, through dedicated signaling, an in-coverage UE that is expected to be unstable in connection to measure a D2D signal of a neighbor relay UE (or potential relay UE) and report the measured value and/or a discovered relay UE (or potential relay UE) ID to the eNB. This method may be applied to an RRC connected UE. Alternatively, the eNB may signal to the UE, through a broadcast message (such as SIB or UE common RRC), to report a result of D2D link quality measurement. The eNB may identify information about a D2D link that is measured and reported by the UE to refer to the information upon configuring a resource pool size. Alternatively, when communication performance deteriorates due to poor quality of the D2D link, the eNB may use information about quality of the D2D link of the UE to indicate that the UE should be switched to cellular based (Uu link, uplink/downlink) communication.

Meanwhile, if both a relay UE (or potential relay UE) and an OON UE are discovered among in-network UEs, or if a discovery signal of the OON UE is detected, a measurement value of the relay UE and/or the OON UE may be reported to the eNB.

Alternatively, among the in-network UEs, if the RSRP (and/or RSRQ) from the eNB is above a predetermined threshold value and if a discovery signal, a synchronization signal, or a D2D communication signal of the OON UE is detected, a measurement value of the relay UE and/or the OON UE may be reported to the eNB. This method functions to cause the potential relay UE to check whether the OON UE is discovered in the vicinity of the potential relay UE and report the result of measurement to the network to indicate that a relay path can be configured. Only when a relay request or information indicating that relaying is needed is detected from a discovery signal of the OON UE, the UE may report measurement information about the OON UE to the network. A UE that detects the OON UE may report RSRP and/or RSRQ information thereof to the network.

Alternatively, the relay UE (or potential relay UE) may measure a D2D signal of an in-coverage UE or an out-of-coverage UE discovered in the vicinity thereof and report a measurement value and/or an ID of the discovered UE to the eNB.

Alternatively, the relay UE may report the measurement value and/or the ID of the discovered UE to the eNB through dedicated signaling of the eNB.

Alternatively, when a D2D measurement report such as an SPS is triggered, the relay UE may report the measurement value and/or ID of the discovered UE to the eNB at a predetermined period.

Measurement when Discovery Signal is Repeatedly Transmitted

If a discovery signal of one MAC PDU is repeatedly transmitted in one discovery period, the following methods may be used. For example, if transmission of the discovery signal three times is configured (or preconfigured) by a network, a CRC may be passed in the last third discovery signal. In this case, the following methods are used for DMRS measurement of the discovery signal.

First, a result of measurement only for a subframe in which a CRC is passed may be included in a DMRS measurement sample. Since measurement needs to be performed only for a DMRS of a subframe in which a CRC is accurately passed, a measurement value of a DMRS of a subframe in which decoding fails does not need to be stored. Therefore, implementation of a UE is simplified.

Second, if a CRC is successfully passed, a DMRS measurement value of a resource position at which a discovery signal of a previous subframe is estimated to be transmitted may be included in the DMRS measurement value. This method serves to include more samples in the measurement value. Since the number of measurement samples is increased, measurement accuracy can be improved.

Third, a UE always stores a DMRS measurement value of a subframe in which all discovery signals are repeatedly transmitted in a period and, if a CRC is passed, the UE may reflect all DMRS measurement sample values in DMRS measurement. This serves to improve measurement accuracy by including samples before/after a CRS is passed in measurement. That is, a reception UE always stores DMRS measurement values for all repetitions in a buffer and, if a CRC is passed, corresponding measurement values are included as measurement filter input values. In addition, even if decoding is successful, a DMRS should be measured on a resource on which the next discovery message is estimated to be transmitted in a period.

In the above method, if a measurement value of a subframe in which a CRC is not passed is included, a discovery signal may not be transmitted at all. Therefore, the measurement value may be included in the measurement sample only when the DMRS measurement value is above a predetermined threshold value. This serves to exclude the case in which the discovery signal is not transmitted due to WAN transmission or synchronization signal transmission Meanwhile, when a UE measures the DMRS of the discovery signal, a peer UE (relay UE or remote UE) may be distant from a range in which the discovery signal can be detected so that the DMRS which has been well measured may not be measured after a predetermined timing or CRC pass/non-pass of the discovery signal may be repeated due to a poor connection state from the beginning. If the DMRS is included in a measurement sample only when a discovery signal is CRC-passed, a measurement value may be over-estimated because the UE does not know the fact that connection with the relay UE is poor. To prevent this phenomenon, the following methods may be used.

First, if the discovery signal is not CRC-passed within a predetermined time window, an average of measurement values may be calculated by setting a discovery signal measurement value of a corresponding period to 0.

Second, measurement values of only CRC-passed DMRSs in a predetermined time window may be averaged/filtered. If i) all CRCs are not passed in the predetermined time window, ii) measurement fails (CRC failure) a predetermined number of times or more in the predetermined time, or iii) a timer value exceeds a predetermined threshold by initializing a timer to 0 when a CRC is passed and activating the timer when the CRC is not passed, then it is declared that measurement has failed and a measurement value for a corresponding UE may be initialized or discarded. In this method, even when a few CRC failures occur in the middle of measurement, this is not reflected in a result of measurement average/filtering and relay selection is affected only when CRC failures consecutively occur during a predetermined time.

In the above methods, the following two methods may be considered to configure a first measurement result value.

First, a DMRS measurement value of a discovery signal in a first CRC-passed subframe/period may be set to a latest (last) input value of all zero time windows. Next measurement is added in a queue form while a time window is shifted. In this method, since many zero values are already included in the window even if a first CRC is passed, a sufficiently high measurement value will be included and this method will affect relay selection or other operations, only when measurement is successful for a predetermined time (for a time during which all CRC-passed measurement values are included in the window).

Second, as another method, a first measurement value may be set to an averaging/filtering result value of DMRS measurement values of a discovery signal in a first CRC-passed subframe/period. In this method, whenever the next measurement value is added, the number of input samples increases and averaging is performed as many times as the number of samples. Therefore, there is no initial delay unlike the previous method.

Meanwhile, since the first symbol of a D2D subframe is used for AGC, an average power may not be accurately estimated. In this case, the first symbol of a subframe in which data is received may be excluded from calculation of an RSSI.

If a UE measures the RSSI in a communication pool, measurement of the RSSI may be performed only with respect to a pool in which a relay UE in which the UE is interested transmits a signal. If measurement of a D2D RSRQ is performed for the purpose of determining relay selection/reselection, accurate interference measurement may be performed when the RSSI is measured only in a pool in which the relay UE transmits a signal. If multiple relay UEs can perform transmission in multiple resource pools, the RSSI may be measured in all resource pools in which the relay UEs transmit signals. When calculation of the RSSI per relay UE is performed, the RSSI may be calculated only in a pool in which the relay UE transmits a signal or an average of RSSI values may be calculated in all resource pools in which the relay UE can transmit a signal. In the former case, a specific relay UE is targeted and the RSSI is measured only in a pool in which the targeted relay UE transmits a signal so that interference may be accurately measured. In the latter case, the RSSI is measured without distinguishing between UEs so that implementation is simplified.

If subframes of a relay UE and a remote UE are distinguished by a T-RPT or a predetermined bitmap in one resource pool (i.e., a subframe in which the relay UE transmits a signal and a subframe in which the remote UE transmits a signal are distinguished in one resource pool), the RSSI may be measured only with respect to the subframe in which the relay UE can transmit a signal because measurement of the RSSI in the subframe in which the remote UE transmits a signal is not helpful to reception performance measurement of the relay UE.

If an SA period in which the relay UE transmits a signal and an SA period in which the remote UE transmits a signal in one resource pool are distinguished (or signaled), the RSSI may be measured only with respect to the SA period in which the relay UE transmits a signal.

Processing when Multiple DMRSs are Detected During Measurement

A received power of a DMRS of a D2D signal transmitted by a relay UE, a destination UE, or an OON UE may be measured. To distinguish the UE from other D2D UEs, an in-coverage destination UE (a UE requiring reception of a signal from the relay UE though the UE is in coverage or a UE having an RSRP (and/or RSRQ) less than a predetermined threshold) or an out-of-coverage UE may generate an additional DMRS and/or a scrambling sequence (e.g., using $n_{ID}^{RS}$ or $n_{ID}^{cell}$ set to 511) to transmit a D2D signal (discovery/communication signal).

Alternatively, the relay UE may generate a DMRS and/or a scrambling sequence (e.g., using $n_{ID}^{RS}$ or $n_{ID}^{cell}$ set to 511) to transmit the D2D signal (discovery/communication signal), upon transmitting the discovery or D2D communication signal.

Alternatively, the relay UE may configure a different DMRS CS and/or OCC from legacy D2D UEs and transmit the DMRS CS and/or the OCC. For example, the DMRS CS of the discovery signal of the relay UE may be set to 6 or the OCC of the discovery signal of the relay UE may be set to [1-1].

The relay UE may transmit the discovery signal on a separate resource in order to distinguish from other D2D UEs. For example, a type-2B discovery signal may be configured only for the relay UE and an OON or in-coverage UE may receive the discovery signal and perform measurement.

In the above method, since all UEs use the same DMRS sequence in a discovery signal in Release-12, measurement of the relay UE may not be correctly performed. To solve this problem, an additional DMRS may be used or the relay UE may transmit the discovery signal in a separate resource region.

Meanwhile, if numerous discovery signals are detected in one discovery period like a type-1 discovery signal or too many UEs transmit discovery signals on a D2D communication channel (PSSCH), a reception UE should store many measurement values, thereby increasing implementation complexity. In this case, the number of stored measurement values may be effectively reduced by the following methods.

An out-of-coverage UE and/or an in-coverage UE preferentially stores a measurement value of a discovery signal transmitted by a relay UE or a discovery signal of a UE intended to perform relaying even though the UE is the relay UE. For example, when a remote UE receives discovery signals of multiple UEs, performs measurement of the discovery signals, and averages measurement values, the remote UE preferentially stores a measurement value of the discovery signal transmitted by the relay UE. When it is assumed that the size of buffers for storing measurement values is 50, if the 50 buffers are already full and a discovery signal of a new relay UE is received, a measurement value of a non-relay UE is emptied and a measurement value of the new relay UE is stored. An old measurement value of the non-relay UE may be emptied first. Alternatively, among non-relay UEs, a measurement value of a UE for which measurement update is frequently generated is preferentially stored and a measurement value of a UE having a low update period is preferentially emptied.

A 1-bit indicator for requesting relaying may be included in a discovery message among discovery signals of out-of-coverage UEs. A UE requiring relaying (or requesting relaying) among the out-of-coverage UEs may distinguish a discovery signal from discovery signals of other out-of-coverage UEs by configuring a different DMRS CS or OCC or a different bit sequence of CRC masking from other UEs. Alternatively, a UE requiring (or requesting) relaying among out-of-coverage UEs may set a cell ID part to 511 during generation of a DMRS sequence. This method causes a reception UE to perform blind detection of a DMRS and perform determination as to whether to store a measurement value by judging a state of the UE.

The relay UE may preferentially store a measurement value of a UE requesting relaying among discovery signals of out-of-coverage UEs. For example, when the size of buffers for storing measurement values of the relay UE is limited to 50 and the 50 buffers are already full, if a discovery signal of a UE requesting relay is detected, the relay UE may empty a measurement value of a UE that does not request relaying and store a measurement value of the UE requesting relaying.

In the above-described methods, if measurement of a D2D link is only for the relay UE or path selection, a rule may be determined such that measurement values may not be stored except for a D2D signal of a UE requesting relay and a D2D signal transmitted by the relay UE. To prevent implementation complexity from being excessively increased, a UE performing measurement may limit a maximum measurement buffer size to a predetermined number (e.g., 16). In this case, the number 16 is selected in consideration of the fact that the maximum number of Radio Resource Management (RRM) measurements in a current cellular system is 16, so that commonness of implementation is maintained.

Meanwhile, for reliable measurement, a PSDCH of a short period may be configured and a DMRS of the PSDCH may be measured. Herein, it is necessary to configure a period such that a PDSCH period is a multiple of an SA/data period. For example, if the SA period is 60 ms, then the discovery period may be desirably a multiple of 60 ms. A minimum period of a legacy discovery signal is 320 ms. To secure measurement accuracy, a discovery period of 40, 80, or 160 ms may be configured. The SA/data period of TDD configurations 0 and 6 may be set to a number shown below or a multiple of the number. That is, a period in which a PSDCH is transmitted may be 70 ms, 140 ms, or 280 ms which is a multiple of 70 ms. In the case of TDD configuration 0, the period may be {70, 140, 280} and in the case of TDD configuration 6, the period may be {60, 120, 240}. Accordingly, if a shorter discovery period is configured, the period may be set to the above values rather than 40, 80, and 160 TDD configurations 0 and 6. In this case, the PDSCH can smoothly coexist with the SA/data.

Meanwhile, if a network configures a discovery resource pool or if an SA/data pool and a discovery pool overlap in pre-configuration, a transmission/reception UE may use the following priority.

It is desirable that the SA/data pool not overlap with the discovery pool. In the time domain, a resource region may be configured in order of SA→discovery→data resources or in order of discovery→SA→data resources.

If the SA/data pool overlaps with the discovery pool, a resource region may be prioritized in order of SA→discovery→data resources or in order of discovery→SA→data resources. The reason why SA has a high priority is that, if the SA is not received, data may not be received for one SA period. In addition, the discovery signal is prioritized because a relay operation/relay path may be selected according to a discovery result or measurement.

The examples of the above-described proposed methods may also be included in one of the implementation methods of the present invention and, therefore, it is obvious that the examples are regarded as the proposed methods. Although the above proposed methods may be independently implemented, the proposed methods may be implemented in the form of combination (aggregation) of some of the proposed methods. Information as to whether the proposed methods are applied (or information about rules of the proposed methods) may be indicated to the UE by the eNB through predefined signaling (e.g., physical layer signaling or higher layer signaling).

Configuration of Apparatuses According to Embodiment of the Present Invention

FIG. 10 is a diagram illustrating configuration of a transmission point and a UE according to an embodiment of the present invention.

Referring to FIG. 10, a transmission point 10 according to the present invention may include a reception module 11, a transmission module 12, a processor 13, a memory 14, and a plurality of antennas 15. Use of the plurality of antennas 15 means that the transmission point 10 supports MIMO transmission and reception. The reception module 11 may receive uplink signals, data, and information from a UE. The transmission module 12 may transmit downlink signals, data, and information to a UE. The processor 13 may provide overall control to the transmission point 10.

The processor 13 of the transmission point 10 according to the embodiment of the present invention may perform necessary operations in the afore-described embodiments.

The processor 13 of the transmission point 10 processes received information and information to be transmitted to the outside of the transmission point 10. The memory 14 may store the processed information for a predetermined time and may be replaced with a component such as a buffer (not shown).

Referring to FIG. 10 again, a UE 20 according to the present invention may include a reception module 21, a transmission module 22, a processor 23, a memory 24, and a plurality of antennas 25. Use of the plurality of antennas 25 means that the UE 20 supports MIMO transmission and reception using the plurality of antennas 25. The reception module 21 may receive downlink signals, data, and information from an eNB. The transmission module 22 may transmit uplink signals, data, and information to an eNB. The processor 23 may provide overall control to the UE 20.

The processor 23 of the UE 20 according to the embodiment of the present invention may perform necessary operations in the afore-described embodiments.

The processor 23 of the UE 20 processes received information and information to be transmitted to the outside of the UE 20. The memory 24 may store the processed information for a predetermined time and may be replaced with a component such as a buffer (not shown).

The above transmission point and UE may be configured in such a manner that the various embodiments of the present invention described above may be implemented independently or in combination of two or more thereof. A redundant description is omitted for clarity.

The description of the transmission point 10 in FIG. 10 is identically applicable to a relay as a downlink transmitter or an uplink receiver, and the description of the UE 20 in FIG. 10 is identically applicable to a relay as a downlink receiver or an uplink transmitter.

The embodiments of the present invention may be implemented by various means, for example, hardware, firmware, software, or a combination thereof.

In a hardware configuration, the method according to the embodiments of the present invention may be implemented by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, or microprocessors.

In a firmware or software configuration, the method according to the embodiments of the present invention may be implemented in the form of modules, procedures, functions, etc. performing the above-described functions or operations. Software code may be stored in a memory unit and executed by a processor. The memory unit may be located at the interior or exterior of the processor and may transmit and receive data to and from the processor via various known means.

The detailed description of the preferred embodiments of the present invention has been given to enable those skilled in the art to implement and practice the invention. Although the invention has been described with reference to the preferred embodiments, those skilled in the art will appreciate that various modifications and variations can be made in the present invention without departing from the spirit or scope of the invention described in the appended claims. Accordingly, the invention should not be limited to the specific embodiments described herein, but should be accorded the broadest scope consistent with the principles and novel features disclosed herein.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. It is obvious to those skilled in the art that claims that are not explicitly cited in each other in the appended claims may be presented in combination as an embodiment of the present invention or included as a new claim by subsequent amendment after the application is filed.

INDUSTRIAL APPLICABILITY

The above-described embodiments of the present invention are applicable to various mobile communication systems.

What is claimed is:

1. A method of performing measurement by a user equipment (UE) in a wireless communication system, the method comprising:
   receiving Device-to-Device (D2D) signals transmitted by a plurality of relay UEs;
   performing first measurement using a Cyclic Redundancy Check (CRC)-passed D2D signal of a first ID;
   performing second measurement using a CRC-passed D2D signal of a second ID;
   wherein a result of the first measurement is used after updating by using a result of the second measurement, when the first ID is same with the second ID, and
   wherein the result of the first measurement is used without the updating by using the result of the second measurement, when the first ID is different from the second ID.

2. The method according to claim 1, wherein the D2D signals are Physical Sidelink Discovery Channels (PSDCHs) and the first and second measurements are calculated of an average of received powers of Demodulation Reference Signal (DMRS) Resource Elements (REs) of the PSDCHs.

3. The method according to claim 1, wherein a period in which the PDSCHs are transmitted is one of {40 ms, 80 ms, 70 ms, 140 ms, 280 ms, 60 ms, 120 ms, and 240 ms}.

4. The method according to claim 1, wherein the UE measures a D2D Received Signal Strength Indicator (RSSI) on symbols in a subframe except for a first symbol and a last symbol of the subframe.

5. A User Equipment (UE) for performing measurement in a wireless communication system, the UE comprising:
   a transmitter and a receiver; and
   a processor,
   wherein the processor configured to receive Device-to-Device (D2D) signals transmitted by a plurality of relay UEs, to perform first measurement using a Cyclic Redundancy Check (CRC)-passed D2D signal of a first ID, to perform second measurement using a CRC-passed D2D signal of a second ID; and
   wherein a result of the first measurement is used after updating by using a result of the second measurement, when the first ID is same with the second ID, and
   wherein the result of the first measurement is used without the updating by using the result of the second measurement, when the first ID is different from the second ID.

6. The UE according to claim 5, wherein the D2D signals are Physical Sidelink Discovery Channels (PSDCHs) and the first and second measurements are calculated of an average of received powers of Demodulation Reference Signal (DMRS) Resource Elements (REs) of the PSDCHs.

7. The UE according to claim 5, wherein a period in which the PDSCHs are transmitted is one of {40 ms, 80 ms, 70 ms, 140 ms, 280 ms, 60 ms, 120 ms, and 240 ms}.

8. The UE according to claim 5, wherein the UE measures a D2D Received Signal Strength Indicator (RSSI) on symbols in a subframe except for a first symbol and a last symbol of the subframe.

* * * * *